(12) United States Patent
Kukula

(10) Patent No.: US 7,257,786 B1
(45) Date of Patent: Aug. 14, 2007

(54) METHOD AND APPARATUS FOR SOLVING CONSTRAINTS

(75) Inventor: James Herbert Kukula, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 663 days.

(21) Appl. No.: 10/643,050

(22) Filed: Aug. 18, 2003

(51) Int. Cl.
*G06F 17/50* (2006.01)
*G06F 17/10* (2006.01)

(52) U.S. Cl. .................. 716/5; 716/2; 716/3; 716/4; 703/2

(58) Field of Classification Search ........... 716/1–6, 716/8, 10, 12, 14, 16, 17; 703/2, 14, 15
See application file for complete search history.

(56) References Cited

U.S. PATENT DOCUMENTS

| | | | |
|---|---|---|---|
| 5,999,714 A * | 12/1999 | Conn et al. ............. | 716/2 |
| 6,389,576 B1 * | 5/2002 | Lam et al. ............. | 716/2 |
| 6,449,761 B1 * | 9/2002 | Greidinger et al. ....... | 716/11 |
| 6,578,176 B1 * | 6/2003 | Wang et al. ............ | 716/2 |
| 6,816,825 B1 * | 11/2004 | Ashar et al. ........... | 703/14 |
| 6,886,149 B1 * | 4/2005 | Teig et al. ............ | 716/12 |
| 7,017,043 B1 * | 3/2006 | Potkonjak ............. | 713/176 |
| 7,020,861 B2 * | 3/2006 | Alpert et al. .......... | 716/6 |
| 7,093,220 B2 * | 8/2006 | Fallon et al. .......... | 716/10 |
| 7,184,919 B2 * | 2/2007 | Carbonell et al. ....... | 702/122 |
| 2001/0010091 A1 * | 7/2001 | Noy .................. | 716/4 |
| 2003/0084411 A1 * | 5/2003 | Moskewicz et al. ...... | 716/3 |
| 2004/0210860 A1 * | 10/2004 | Ganai et al. ........... | 716/5 |
| 2004/0243964 A1 * | 12/2004 | McElvain et al. ........ | 716/12 |

OTHER PUBLICATIONS

Hulgaard et al., "Equivalence checking of combinational circuits using Boolean expression diagrams", Jul. 1999, Computer-Aided Design of Integrated Circuits and Systems, IEEE Transactions on, vol. 18, Issue 7, pp. 903-917.*
IBDDs: an efficient functional representation for digital circuits Jain et al., "IBDDs: an efficient functional representation for digital circuits", Mar. 16-19, 1992, Design Automation, 1992. Proceedings. [3rd] European Conference on, pp. 440-446.*

(Continued)

*Primary Examiner*—Paul Dinh
*Assistant Examiner*—Helen Rossoshek
(74) *Attorney, Agent, or Firm*—Park, Vaughan & Fleming, LLP

(57) ABSTRACT

An approach to solving combinational constraints, comprising compile and generate phases, is presented. The compile phase constructs successive sets of constraints, each with a solution generator, according to blocks of a partition of the constraints' random variables. Interleaving conjunction of the constraints, with existential quantification of the constraints, is attempted. The generate phase uses a reverse-order, block-by-block, process for solving constraints, where variables of each solution generator processed have been predetermined, by the processing of earlier blocks, except for the random variables of the current block. The present invention can be used in conjunction with image computation. Successive sets of reachable states of an FSM at successive time steps can be determined by successive applications of the compile phase, with each set of solution generators being saved. The sets of solution generators permit a backward sequence of states, from an error state back to a start state, to be determined.

10 Claims, 8 Drawing Sheets

OTHER PUBLICATIONS

Kalla et al., "A BDD-based satisfiability infrastructure the unate recursive paradigm", Mar. 27-30, 2000, ☐☐Design, Automation and Test in Europe Conference and Exhibition 2000. Proceedings, pp. 232-236.*

Zeng et al., LPSAT: a unified approach to RTL satisfiability, Mar. 13-16, 2001, Design, Automation and Test in Europe, Conference and Exhibition, Proceedings, pp. 398-402.*

Yuan et al., "Simplifying Boolean constraint solving for random simulation-vector generation", Nov. 10-14, 2002, ☐☐Computer Aided Design, 2002. ICCAD 2002. IEEE/ACM International Conference on, pp. 123-127.*

"Representing circuits more efficiently in symbolic model checking." Burch, J.R.; Clarke, E.M.; Long, D.E. ACM/IEEE 28th Design Automation Conference, 1991. Publication Date: Jun. 17-21, 1991. On pp. 403-407.

"Efficient Model Checking by Automated Ordering of Transition Relation Partitions." Daniel Geist, Ilan Beer. Proceedings of the 6th International Conference on Computer Aided Verification. Publication Date: Jun. 21-23, 1994. On pp. 299-310.

"Early quantification and partitioned transition relations." Hojati, R.; Krishnan, S.C.; Brayton, R.K. Proceedings, IEEE International Conference on Computer Design (ICCD): VLSI in Computers and Processors, 1996. Publication Date: Oct. 7-9, 1996. On pp. 12-19.

"Border-Block Triangular Form and Conjunction Schedule in Image Computation." In-Ho Moon, Gary D. Hachtel, Fabio Somenzi. Proceedings of the Third International Conference on Formal Methods in Computer-Aided Design. Publication Date: Nov. 1-3, 2000. On pp. 73-90.

"Efficient BDD algorithms for FSM synthesis and verification." R. K. Ranjan, A. Aziz, R. K. Brayton, B. F. Plessier, and C. Pixley. International Workshop for Logic Synthesis, May 1995. Lake Tahoe, CA.

"Implicit state enumeration of finite state machines using BDD's." Touati, H.J., Savoj, H., Lin, B., Brayton, R.K. and Sangiovanni-Vincentelli, A. IEEE International Conference on Computer-Aided Design (ICCAD), 1990. Digest of Technical Papers. Publicaton Date: Nov. 11-15, 1990. On pp. 130-133.

* cited by examiner

METHOD AND APPARATUS FOR SOLVING CONSTRAINTS

CROSS REFERENCE TO RELATED APPLICATIONS

This application is related to the following U.S. patent application, herein incorporated by reference, and referred to herein as the '0505 application:

"Method and Apparatus For Solving Constraints," filed with Express Mail No. EU600-802-961US on the same date as the present application, with inventors Brian Eugene Lockyear, James Herbert Kukula and Robert F. Damiano, and having U.S. patent application Ser. No. 10/642,885.

FIELD OF THE INVENTION

The present invention relates generally to the solution of sets of constraints, and more particularly to the solution of sets of constraints in connection with the generation of random test data.

BACKGROUND OF THE INVENTION

Random test data has a wide variety of uses. A particularly important application of random test data is in the verification of digital electronic circuits in order to exercise a wide variety of circuit paths for possible faults.

To tackle the increasing complexity of integrated digital electronic circuits, designers need faster and more accurate methods for verifying the functionality and timing of such circuits, particularly in light of the need for ever-shrinking product development times.

The complexity of designing such circuits is often handled by expressing the design in a high-level hardware description language (HLHDL). The HLHDL description is then converted into a physical circuit specification through processes, well known to those of ordinary skill in the art as "synthesis," involving translation and optimization. Examples of an HLHDL are:

1. IEEE Standard 1364-2001, for the Verilog Hardware Description Language. The Institute of Electrical and Electronics Engineers, Inc., 345 East 47$^{th}$ Street, New York, N.Y. 10017-2394, USA.
2. IEEE Standard 1076-1993, for the VHDL Hardware Description Language. ISBN: 1559373768, August 1994. The Institute of Electrical and Electronics Engineers, Inc., 345 East 47$^{th}$ Street, New York, N.Y. 10017-2394, USA.

An HLHDL description can be verified by simulating the HLHDL description itself, without translating the HLHDL to a lower-level implementation. This simulation is subjected to certain test data and the simulation's responses are recorded or analyzed.

Verification of the HLHDL description is important since detecting a circuit problem early prevents the expenditure of valuable designer time on achieving an efficient circuit implementation for a design which, at a higher level, will not achieve its intended purpose. In addition, simulation of the design under verification (DUV) can be accomplished much more quickly in an HLHDL than after the DUV has been translated into a lower-level, more circuit-oriented (e.g., gate-level) implementation.

The verification of HLHDL descriptions has been aided through the development of Hardware Verification Languages (or HVLs). An HVL can be implemented and supported by a test-bench automation (TBA) tool. Among other goals, HVLs are intended to provide programming constructs and capabilities which are more closely matched to the task of modeling the environment of an HLHDL design than are, for example, the HLHDL itself or software-oriented programming languages (such as C or C++). HVLs permit a DUV, particularly those DUVs expressed in an HLHDL, to be tested by stimulating certain inputs of the DUV and monitoring the resulting states of the DUV.

Most HVLs include a programming mechanism by which to specify constraints on a set of variables. Constraints have the advantage of permitting "legal" sets of inputs to a DUV (i.e., inputs to the DUV that simulate the DUV's environmental restrictions) to be specified in a declarative programming manner that is often easier to specify than, for example, a procedural approach. Such randomly selected solutions to these constraints can be used to provide stimulus to the DUV. Consequently, there is a need for an efficient constraints solving system for use with TBA tools.

A high-level view of this commonly used functional verification methodology is depicted in FIG. 3.

The high-level test bench is written in an HVL, that is supported by the underlying TBA tool, and has two main goals. First, the test bench seeks to apply random stimulus and/or directed tests to the DUV by interfacing to a simulator. Second, the test bench seeks to analyze results from the simulation by performing assertion checking and by measuring the functional coverage. Most designs have assumptions on how they interact with their environment. A goal of the test-bench is to generate random stimuli to the DUV that satisfy these environmental restrictions. Consequently, most commercial and industry-standard HVLs provide means to specify constraints on certain variables (that are declared within the test-bench) and the ability to randomize a certain set of these variables upon demand. The constraints themselves could be arbitrary expressions on signed or unsigned variables with varying bit-widths using the high-level operators supported by the HVL. The results of the randomization specified by the test-bench are translated (through procedural code within the test-bench) by the TBA tool into legal random stimuli to the DUV.

When control is handed over to the simulator of the DUV, the effect of the newly-generated stimulus from the TBA tool is simulated until there are no more events for the simulator in the current clock cycle. At this point, control is handed back to the test-bench, which does assertion checking for the truth of certain properties (based on the current signal values of the DUV) and measures functional coverage (as defined by test-bench criteria). In addition, the test bench can receive feedback from the DUV, in the form of state variables (sv's), that it uses to adaptively adjust the course of its test generation. The constraints in the test-bench could also contain test-bench state variables (sv's). The test-bench, through the TBA tool, then generates the next set of random stimuli to the DUV, by finding a solution to the random variables of its constraints, given the current values for the sv's, and the process continues, until the test-bench finishes.

While constraints provide a powerful specification language, for such applications as design verification, finding an assignment to their variables that satisfies them can be complex. It is therefore desirable to have improved methods for finding solutions to a constraint or a set of constraints.

SUMMARY OF THE INVENTION

The present invention comprises techniques for solving combinational constraint expressions.

The combinational constraints solving problem can be formulated as follows. Consider a set of "m" variables, $V=\{v_1, v_2, \ldots, v_m\}$, and a set of "n" relations or constraints, $C=\{C_0, C_1, \ldots, C_n\}$, such that each constraint is a relation between expressions over a subset of the variables in V. Separate sets of constraints, identified by a value "j," can be distinguished by a superscript as follows: $C^j=\{C_0^j, C_1^j, \ldots C_{n_j}^j\}$.

A constraint is any expression that evaluates to a Boolean value (i.e., either TRUE or FALSE). In this context, an expression is any legal sequence of variables and operators, as defined in the language used to express the constraints.

A variable in V can be a random variable (rv) or a state variable (sv). The set of random variables (or rv's) in V can be referred to as r_collec and the set of state variables (or sv's) in V can be referred to as s_collec. The constraint solving problem comprises finding legal assignments to all random variables in V, given the particular values currently assigned to the state variables in V, such that all the constraints in C are satisfied.

The approach of the present invention, to solving a set of constraints, is divided into two phases: a compile phase and a generate phase. Both phases can be accomplished with a BDD representation of the constraints to be solved.

The compile phase constructs a set of functions referred to as solution generators. The compile phase attempts to interleave conjunction of constraints, in the formation of successive solution generators, with the application of existential quantification of rv's. Conjunction tends to increase the size of a BDD representation, while existential quantification tends to decrease BDD size. Therefore, interleaving the application of these two operations instead of, for example, applying all opportunities for conjunction before seeking existential quantification, tends to decrease the maximum size of the BDD that needs to be processed. Decreasing BDD size can increase the size of the constraint set that can be solved, for a given level of computational resources.

The generate phase solves the solution generators one-by-one, using the solution of a currently-solved solution generator to find the solution to a next solution generator. The net result, once all the solution generators have been solved, is an overall solution to the set of random variables represented by an input constraint set.

The compile phase can be performed once, prior to the start of a simulation of a DUV, with the generate phase performed after each step of DUV simulation has completed and a new given set of sv's have been determined.

The compile phase uses a partition of r_collec to produce a totally ordered collection of blocks: $R^0, R^1, \ldots R^P$. The blocks are processed singly and in order. Each step "j," of processing the blocks, takes as input a set of component constraints $C^j=\{C_0^j, C_1^j, \ldots C_{n_j}^j\}$, and constructs from it a new set of component constraints $C^{j+1}=\{C_0^{j+1}, C_1^{j+1}, \ldots C_{n_{j+1}}^{j+1}\}$ along with a generating constraint $G^j$.

The generating constraint $G^j$ is the result of conjoining each member of the component constraints set $C^j$ whose support has a non-empty intersection with block $R^j$.

The new set of component constraints $C^{j+1}$ is comprised of the union of the following: i) the remaining component constraints of $C^j$ that were not selected for conjunction in $G^j$; and ii) the generating constraint $G^j$, except that the rv's of $R^j$ are existentially quantified from it (the $\exists R^j(G^j)$ term).

The constraints can be represented as BDDs since efficient procedures, for performing the above operations, are known.

As can be seen from the above procedure, at each step in processing a block $R^j$, the rv's of $R^j$ are removed from the succeeding set of component constraints $C^{j+1}$ that are processed according to block $R^{j+1}$. Thus conjunction of constraints is interleaved with existential quantification of rv's.

The above process can continue until at least $C^p$ and $G^p$ have been produced. Alternatively, the process can continue until $C^p$ and the $\exists R^p(G^p)$ term (which would be part of a $C^{p+1}$ constraint set) have been created.

The compile phase has produced a sequence of solution generators:

$G^0, G^1, \ldots G^p$. In the generate phase, the solution generators are used to produce solutions to the rv's, given the values for the sv's. The generate phase relies upon a reverse-order, block-by-block process for solving constraints where the sv and rv values of each solution generator processed have been predetermined, by the processing of earlier blocks, except for the rv's of the current block. When the constraints are represented as BDDs, approaches are known for generating solutions to them.

The generate phase processes the solution generators in reverse order, from $G^p$ down to $G^0$. Each such processing of a solution generator determines a permissible value assignment, for each rv of a block, from $R^p$ down to $R^0$.

At each step "j" in the generate process, where a solution generator $G^j$ is to be solved, values for all rv's in all blocks $R^p$ down to $R^{j+1}$ have already been generated by earlier steps. Because of the procedure by which $G^j$ was produced in the compile phase, solution generator $G^j$ only has rv support for blocks $R^j, R^{j+1}, \ldots, R^p$. Thus, at each step "j," a component constraint solver can find a solution for $G^j$ simply by solving for the rv's in $R^j$, given that values have already been chosen, in the earlier stages of the generate process, for the rv's in $R^{j+1}, R^{j+2}, \ldots R^p$ (and values for the sv's are a given).

Assuming that a $\exists R^p(G^p)$ is determined in the compile phase, the generate procedure begins by testing whether, for the given sv's, $\exists R^p(G^p)$ has a value of one. If $\exists R^p(G^p)$ is equal to one, then it is known that all the solution generators will be solvable in the generate phase. However, if $\exists R^p(G^p)$ is zero, then the rest of the generate phase is avoided.

If $\exists R^p(G^p)$ is not produced in the compile phase, the generate phase will begin by attempting to solve the solution generator $G^p$ for the rv's of block $R^p$. If a solution to $G^p$ is found, for the given sv's, then it is known that all the remaining solution generators will be solvable in the generate phase. If $G^p$ cannot be solved, for the given sv's, then the rest of the generate phase should be avoided.

The present invention has applications beyond that of constraint solving. For example, the present invention can be used in conjunction with known image computation approaches that have been applied to electronic design automation tools.

In order to perform image computation, BDD representations of the following can be determined: an initial set of states ($S_0$) of a finite state machine (FSM) to be verified, the transition relation ($T_M$) of an FSM "M" to be verified (in either partitioned or unpartitioned form), and a set of error states ($E_M$) which, if entered by the FSM, indicate erroneous operation. A transition relation $T_M$ can be comprised of four classes of variables: present state, primary input, auxiliary, and next state.

A typical use of image computation is as follows. With the set of all states "M" can be in at a time "t" represented as $S_t$, an objective of image computation is to determine the following sequence of sets: $S_0, S_1, S_2, \ldots$ If an intersection between an $S_t$ and $E_M$ is found, then it has been determined that "M" can enter a state considered to be erroneous within "t" transitions of "M" from its initial state.

While such image computation has determined that there is at least one state reachable by "M," at a time "t," that is erroneous, a known limitation of such an image computation is that a particular transition path, from an initial state to an erroneous state, is not known.

Determining any set $S_{t+1}$ from a set $S_t$ is a similar process to the compile phase of the present invention. The role of the rv's of the compile phase is assumed by the following variables of $T_M$: present state, primary input, and auxiliary. On a blockwise basis, conjunction and existential quantification of $T_M \cap S_t$ is performed (where $T_M \cap S_t$ represents a set of separate BDDs with implicit conjunction between its members), in an interleaved fashion, to minimize the maximum-sized BDD needed. The resulting BDD ($S_{t+1}$) is a function only of the next state variables and represents the permissible states of "M" at time t+1.

In each application of the present invention to finding an $S_{t+1}$ from an $S_t$, the production of successive sets of constraints, from $C^0$ to $C^{p+1}$, corresponds generally to the known approaches of interleaving to perform image computation. However, the present invention goes beyond such known approaches by saving the solution generator terms $G^0$ to $G^p$.

Once a set of states at a time "t" is determined to intersect $E_M$, the saving of the generator terms permits a specific sequence of states, from an element of $E_M$ at time "t" back to an element of $S_0$ at time zero, to be determined.

The finding of such a specific sequence of states can begin by finding a specific element of $E_M$, referred to herein as $e_M$, that is also an element of $S_t$.

By a single application of the generate phase, upon the set of solution generators $G^0$ to $G^p$, that resulted from the image computation compile of $S_t$ from $S_{t-1}$, a specific element $e_{t-1}$, of $S_{t-1}$, wherein $e_{t-1}$ is able to produce $e_M$, is determined. In this type of generate phase, the value of $e_M$ serves the function of the sv's since $e_M$ provides the given values, with the rv's to be solved for being the variables of type: present state, primary input and auxiliary. The value of $e_{t-1}$ found corresponds to the solution found for the present state variables. It should be noted that solutions for the primary input and auxiliary variables are also found.

Once $e_{t-1}$ is known, by another single application of the generate phase, upon the set of solution generators $G^0$ to $G^p$, that resulted from the image computation compile of $S_{t-1}$ from $S_{t-2}$, a specific element $e_{t-2}$ of $S_{t-2}$, wherein $e_{t-2}$ is able to produce $e_{t-1}$, is determined. Once again, $e_{t-1}$ serves the function of the sv's since $e_{t-1}$ provides the given values, with the rv's to be solved for being the variables of type: present state (providing $e_{t-2}$), primary input and auxiliary.

After "t" such single applications of the generate phase, upon each of the "t" sets of solution generators, a specific path of states, back to an $e_0$ that is a member of $S_0$, is found. In addition to finding a specific path of states, a specific sequence of primary input combinations, to be applied with each of those states, can also determined.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

Figure 1A:
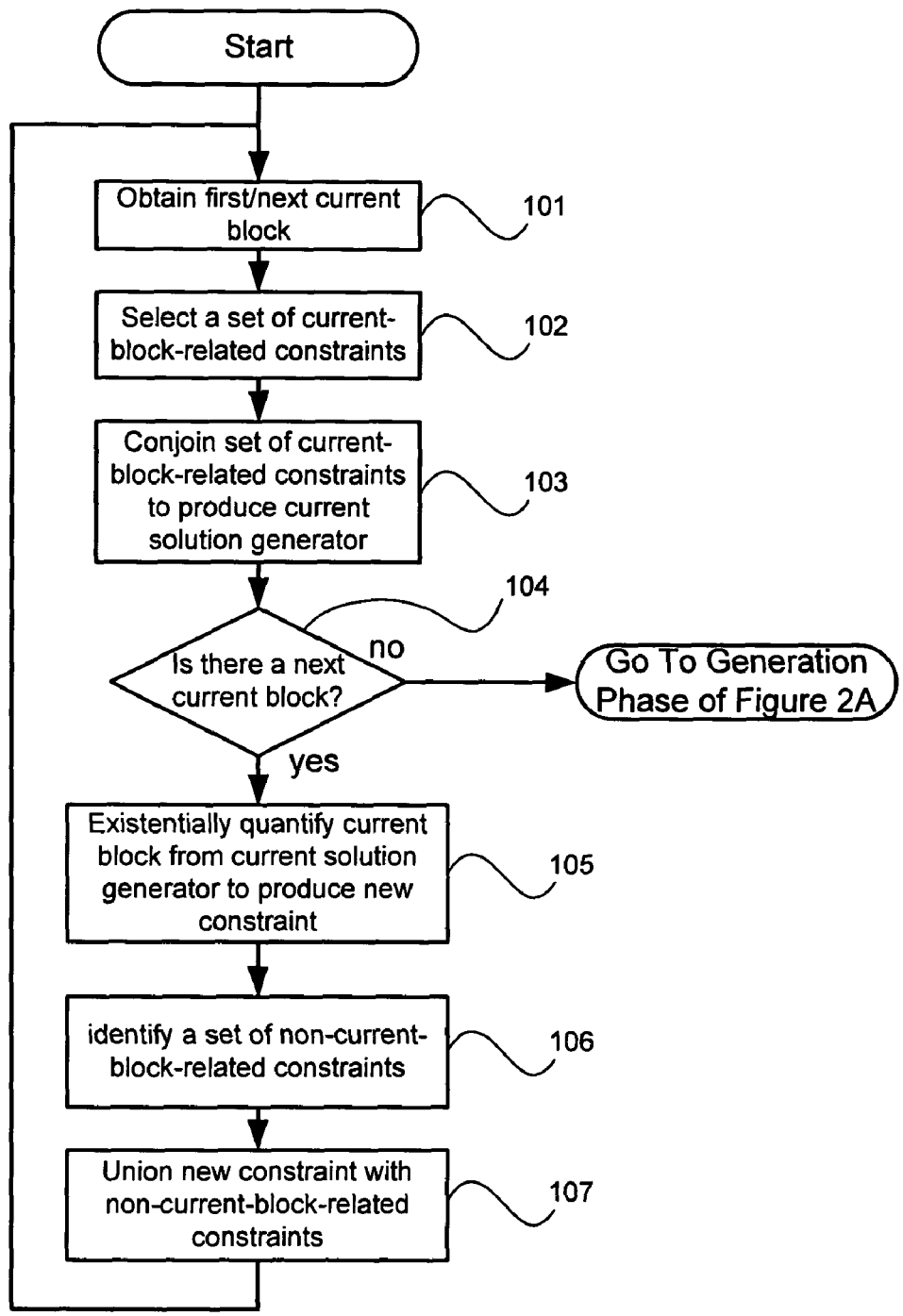
FIGS. 1A-1B graphically depict the compile phase process.

Reference will now be made in detail to preferred embodiments of the invention, examples of which are illustrated in the accompanying drawings. Wherever possible, the same reference numbers will be used throughout the drawings to refer to the same or like parts.

This specification contains pseudo-code to illustrate several embodiments of the invention and to explain its principles. The pseudo-code is loosely based upon the C and C++ programming languages. The C and C++ programming languages are described in such texts as "The C Programming Language", by B. W. Kernighan and D. M. Ritchie, Prentice Hall, Inc., 1988, ISBN 0-13-110362-8 (paperback), 0-13-110370-9 (hardback) and "The C++ Programming Language," by Bjarne Stroustrup, Addison-Wesley Pub. Co., 3rd edition, July 1997, ISBN 0-2018-8954-4, which are herein incorporated by reference. The pseudo-code combines the use of programming-language-like constructs with the utilization of mathematical set notation.

TABLE OF CONTENTS TO DETAILED DESCRIPTION

1. Problem Formulation
2. Constraints Solving
   2.1 Overview
   2.2 Compile Phase
   2.3 Generate Phase
   2.4 Discussion of Example Executions
   2.5 Other Applications
3. Listing of Example Execution
   3.1 Compile Phase
   3.2 Generate Phase
4. Listing of Example Execution, With And Without Decomposition
   4.1 Result of compile phase upon non-decomposed F
   4.2 Result of compile phase upon decomposed F
5. HARDWARE ENVIRONMENT 1. Problem Formulation The present invention comprises techniques for solving combinational constraint expressions.

The combinational constraints solving problem can be formulated as follows. Consider a set of "m" variables, $V=\{v_1, v_2, \ldots, v_m\}$, and a set of "n" relations or constraints, $C=\{C_0, C_1, \ldots, C_n\}$, such that each constraint is a relation between expressions over a subset of the variables in V. Separate sets of constraints, identified by a value "j," can be distinguished by a superscript as follows: $C^j=\{C_0^j, C_1^j, \ldots C_{n_j}^j\}$.

A constraint is any expression that evaluates to a Boolean value (i.e., either TRUE or FALSE). In this context, an expression is any legal sequence of variables and operators, as defined in the language used to express the constraints. Each variable in V has a range of values that can possibly be assigned to it.

A variable in V can be a random variable (rv) or a state variable (sv). The set of random variables (or rv's) in V can be referred to as r_collec and the set of state variables (or sv's) in V can be referred to as s_collec. A random variable can be defined as taking on, at the appropriate point in the execution of an HVL program, a value that is randomly selected from its range, such that all the active constraints that the variable participates in are satisfied. A state variable is similar to an "ordinary" programming language variable, i.e., it is a variable whose value is set by the various assignment constructs of the HVL. In addition to being a function of the HVL program itself, a state variable can also represent feedback from the DUV that is used by the HVL program to adapt the further course of testing. The constraint solving problem comprises finding legal assignments to all random variables in V, given the particular values currently assigned to the state variables in V, such that all the constraints in C are satisfied.

An application of this problem is in generating input stimuli for a random simulation, where the input stimuli must conform to a collection of constraints which model the legal environment of the design under verification. For a set of constraints C, we are repeatedly given values for s_collec and need to find values for r_collec such that all constraints of C evaluate to TRUE for the given s_collec and found r_collec. Further, r_collec should be found in a pseudo-random way that covers the space of all satisfying solutions.

Consider the following constraint solving problem, labeled Example 1, that is written in the OpenVera High Level Verification Language (also referred to herein as "Vera"), a product of Synopsys, Inc., Mountain View, Calif., USA:

Example 1
rand integer a, b, c, d;
integer e;
constraint c1 {
b+a==6;
b+c<5;
c+d+e==10}
}

In the OpenVera language, c1 represents a block of constraints, containing three constraints. Variables "a," "b," "c," and "d" are declared to be random variables of the integer data type, while variable "e" is declared as a static variable of the integer data type. As can be seen, each of the three constraints of block c1 is a declarative statement regarding a relationship that must be maintained between certain variables. The first constraint is that the sum of random variables "a" and "b" must be equal to the constant value 6. The second constraint is that the sum of random variables "b" and "c" must be less than the constant value 5. The third constraint is that the sum of random variable "c", random variable "d" and static variable "e" must equal the constant value 10. The constraint solving problem comprises finding values for "a," "b," "c," and "d," given the current value for "e," that satisfies the declarative statements of block c1. Within an OpenVera program, since OpenVera is an object-oriented programming language, Example 1 is part of a class declaration from which instances are created. The constraint solving process can be invoked by applying a randomize method to an instance. One solution to the constraints of Example 1, given e=8, is: a=3, b=3, c=1 and d=1.

Application of the present invention to the constraints of Example 1 is discussed below in connection with Section 3.

2. Constraints Solving 2.1 Overview

The approach of the present invention, to solving a set of constraints, is divided into two phases: a compile phase and a generate phase. Both phases can be accomplished with a BDD representation of the constraints to be solved.

The compile phase constructs a set of functions referred to as solution generators. The compile phase attempts to interleave conjunction of constraints, in the formation of successive solution generators, with the application of existential quantification of rv's. Conjunction tends to increase the size of a BDD representation, while existential quantification tends to decrease BDD size. Therefore, interleaving the application of these two operations instead of, for example, applying all opportunities for conjunction before seeking existential quantification, tends to decrease the maximum size of the BDD that needs to be processed. Decreasing BDD size can increase the size of the constraint set that can be solved, for a given level of computational resources.

The generate phase solves the solution generators one-by-one, using the solution of a currently-solved solution generator to find the solution to a next solution generator. The net result, once all the solution generators have been solved, is an overall solution to the set of random variables represented by an input constraint set.

Since the procedure of the present invention seeks to conjoin constraints during the compile phase, it can be beneficial, in terms of minimizing the BDD size resulting from such conjoining, to apply a decomposition procedure to such constraints. Such application of decomposition can be performed on the input set of constraints, as a pre-processing procedure, prior to the compile phase. An example decomposition procedure is presented in the '0505 application.

The compile phase can be performed once, prior to the start of a simulation of a DUV, with the generate phase performed after each step of DUV simulation has completed and a new given set of sv's have been determined.

Alternatively, the compile and generate phase can both be re-performed after each simulation step of the DUV. Such stepwise application of the compile phase permits the solution generators to be solved for specific values of the sv's, rather than in terms of the sv's as variables. Determining the solution generators with known values for the sv's can permit the BDD representation of such solution generators to be further reduced in size, compared with the compile-once approach.

2.2 Compile Phase

The compile phase uses a partition of r_collec to produce a totally ordered collection of blocks: $R^0, R^1, \ldots R^p$. The blocks are processed singly and in order. Each step "j," of processing the blocks, takes as input a set of component constraints $C^j = \{C_0^j, C_1^j, \ldots C_{n_j}^j\}$, and constructs from it a new set of component constraints $C^{j+1} = \{C_0^{j+1}, C_1^{j+1}, \ldots C_{n_{j+1}}^{j+1}\}$ along with a generating constraint $G^j$.

For step j=0, $C^0$ is the input constraint set C.

The support of a constraint $C_i$, referred to as a function $S(C_i)$, is defined to be the set of rv's upon which $C_i$ depends.

The generating constraint $G^j$ is the result of conjoining each member of the component constraints set $C^j$ whose support has a non-empty intersection with block $R^j$. A pseudo-code loop for accomplishing this is as follows:

For i=0 to $n_j$

If $(S(C_i^j) \cap R^j) \neq \{\ \}$, then $G^j = G^j \cdot C_i^j$

The new set of component constraints $C^{j+1}$ is comprised of the union of the following: i) the remaining component constraints of $C^j$ that were not selected for conjunction in $G^j$; and ii) the generating constraint $G^j$, except that the rv's of $R^j$ are existentially quantified from it (the $\exists R^j(G^j)$ term). Symbolically:

$$C^{j+1} = \{C_i^j : (S(C_i^j) \cap R^j) = \{\ \}\} \cup \{\exists R^j(G^j)\}$$

The constraints can be represented as BDDs since efficient procedures, for performing the above operations, are known.

As can be seen from the above procedure, at each step in processing a block $R^j$, the rv's of $R^j$ are removed from the succeeding set of component constraints $C^{j+1}$ that are processed according to block $R^{j+1}$. Thus conjunction of constraints is interleaved with existential quantification of rv's.

The above process can continue until at least $C^p$ and $G^p$ have been produced. Alternatively, the process can continue until $C^p$ and the $\exists R^p(G^p)$ term (which would be part of a $C^{p+1}$ constraint set) have been created. Since $\exists R^p(G^p)$ is dependent upon no rv's at all, but only upon the sv's, it's value (when determined by the generate phase, as discussed below, that uses the sv values) will be either one or zero. If $\exists R^p(G^p)$ is zero, this indicates that no solutions exist for the set of constraints $C^0$, at least for the given settings of the sv's. If $\exists R^p(G^p)$ is one, then it is known that there is at least one solution to the set of constraints $C^0$.

Figure 1B:
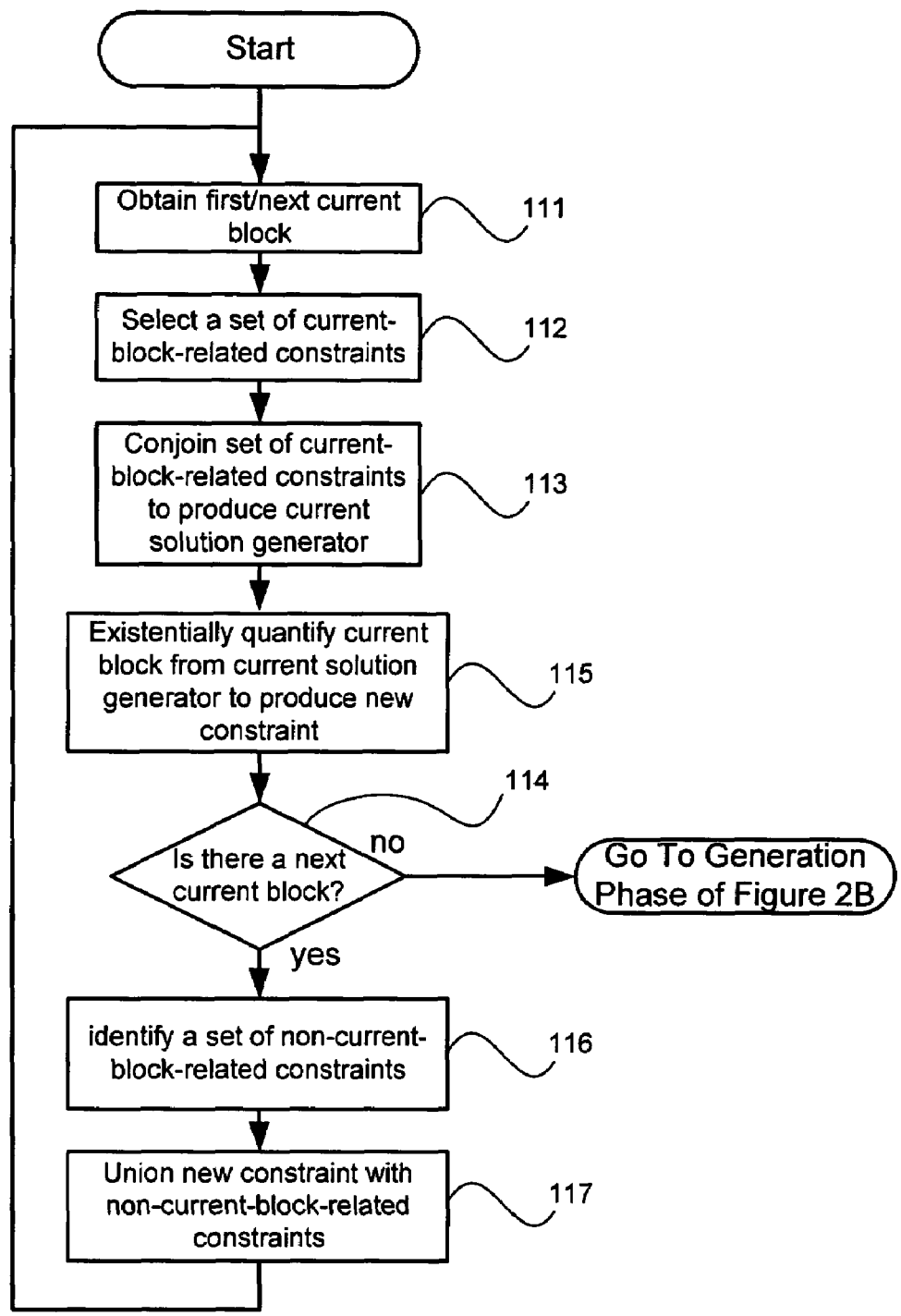

The above-described compile phase process is depicted graphically in FIG. 1. FIG. 1A depicts a compile phase process that continues until a $C^p$ and $G^p$ have been produced, while FIG. 1B depicts a compile phase process that continues until a $C^p$ and $\exists R^p(G^p)$ have been produced.

The compile process of FIG. 1A begins (step 101) by obtaining the first or next current block $R^j$ to be processed, where $0 \leq j \leq p$.

From the set of constraints $C^j$, a set of constraints, related to the current block (the "current-block-related constraints") is selected. Step 102. The set of current-block-related constraints are then conjoined to produce a solution generator $G^j$. Step 103. If there is no next, current block $R^{j+1}$ for processing (the "no" branch of step 104), then it is known that the $G^j$ just produced is $G^p$ and the generate phase is started. If there an $R^{j+1}$ block (the "yes" path of step 104), then the $\exists R^j(G^j)$ term, also referred to as the "new constraint" of the new constraint set $C^{j+1}$, is determined by existentially quantifying the current block from the current solution generator. Step 105. The new constraint set $C^{j+1}$ is then produced by identifying (step 106) a set of constraints in $C^j$ that are not related to the current block $R^j$ (referred to as the set of "non-current-block-related constraints") and unioning (step 107) the new constraint with the set of non-current-block-related constraints. The iteration is completed by obtaining the next block $R^{j+1}$ as the current block (step 101), selecting a set of constraints from $C^{j+1}$ that are related to $R^{j+1}$ by having an rv in their support that is a member of $R^{j+1}$ (step 102), and conjoining (step 103) the set of current-block-related constraints related to the current block to produce the current solution generator $G^{j+1}$.

As an optimization, FIG. 1A can contain an additional test following step 107. Assuming the current block is $R^j$, and that the unioning has produced a succeeding set of constraints $C^{j+1}$, this additional test checks whether the non-current-block-related constraints set, just used in the unioning step 107 to create the succeeding set of constraints, is an empty set. If so, this indicates that the succeeding set of constraints $C^{j+1}$ comprises only a single constraint and that the generation phase (of FIG. 2A) can be started without the need to process any remaining blocks as part of the compile phase. The succeeding set of constraints comprising only a single constraint indicates that subsequent iterations over any remaining blocks, $R^{j+1}$ to $R^p$, cannot yield the advantages of interleaving conjunction with existential quantification, and therefore iteration over any such remaining blocks can be skipped.

FIG. 1B presents the same process as FIG. 1A, except that the process of FIG. 1B has the step of existential quantification (step 115), for determination of the new constraint $\exists R^j(G^j)$, shifted to before the conditional test (step 114) for a next block of the partition. In this way, if there is no next block, $\exists R^p(G^p)$ will have already been determined. As discussed above, since $\exists R^p(G^p)$ depends only upon sv's (and upon no rv's), its value is either a one or a zero, depending upon whether, respectively, there is or is not a solution to the input constraint set $C^0$ (also referred to simply as C) for the given state of the sv's. If there an $R^{j+1}$ block, then the new constraint set $C^{j+1}$ is then produced by identifying (step 116) a set of constraints in $C^j$ that are not related to the current block $R^j$ (referred to as the set of non-current-block-related constraints) and unioning (step 117) the new constraint with the set of non-current-block-related constraints. The iteration is completed by obtaining the next block $R^{j+1}$ as the current block (step 111), selecting (step 112) a set of constraints from $C^{j+1}$ that are related to $R^{j+1}$ by having an rv in their support that is a member of $R^{j+1}$, conjoining (step 113) the set of constraints related to the current block to produce the current solution generator $G^{j+1}$, and existentially quantifying (step 115) $R^{j+1}$ from $G^{j+1}$ to produce the new constraint of any $C^{j+2}$ set that may be produced.

The partition utilized for dividing r_collec into blocks can be defined either before the compile phase begins or dynamically during the compile phase itself. Techniques for defining a suitable partition, developed for formal model checking, can be utilized. A measure of partition's suitability, for example, useful for formal model checking that can also be useful for the present invention, is whether the partition produces blocks such that each block addresses an independent sub-problem.

In the case of a dynamically defined partition, an example approach is as follows. A metric "m" is applied to $C^0$ to determine an initial block $R^0$. Using $R^0$, $G^0$ and $C^1$ are found. Successively, metric "m" is again applied, this time to $C^1$, so that $C^2$ can be determined. Thus, the effects of a partition upon defining a block are able to dynamically influence the generation of subsequent blocks.

The steps of FIGS. 1A and 1B (respectively, steps 101 and 111), that obtain the current block, can each be accomplished according to a partition defined prior to the compile phase, or according to a dynamically defined partition. In the case of a dynamically defined partition, a metric "m" is applied, as part of the step of obtaining the current block, to the current set of constraints to determine the current block. For the first iteration of the procedures of FIG. 1A or 1B, the current set of constraints is $C^0$, while for subsequent iterations the current set of constraints is the $C^{j+1}$ set produced by the just-prior step of unioning (step 107 of FIG. 1A or step 117 of FIG. 1B) the new constraint with set of non-current-block-related constraints.

As a pre-processing step to the compile phase, it can be useful to introduce auxiliary variables into $C^0$. Auxiliary variables are additional variables that are introduced in order to divide constraints into smaller pieces. An auxiliary variable is set to represent, through a constraint, its representation of a portion of another constraint, and the portion of the other constraint is replaced by the auxiliary variable. By dividing the input constraint set into smaller constraints, auxiliary variables provide more degrees of freedom by which constraints that share common rv's can be grouped together. Auxiliary variables are included in blocks, by a partition, in the same manner as rv's.

For purposes of the generate phase, discussed below, auxiliary variables can be treated just like rv's. However, it is possible for certain auxiliary variables to appear in only one solution generator $G^j$, where $0 \leq j \leq p$, in which case the auxiliary variable is referred to as "isolated." In this case, a post-processing phase can be added to the compile phase, that occurs prior to any generation, in which such isolated auxiliary variables are removed by existential quantification from the $G^j$ to be solved in the generate phase.

2.3 Generate Phase

The compile phase has produced a sequence of solution generators: $G^0$, $G^1$, ... $G^p$. In the generate phase, the solution generators are used to produce solutions to the rv's, given the values for the sv's. The generate phase relies upon a reverse-order, block-by-block process for solving constraints where the sv and rv values of each solution generator processed have been predetermined, by the processing of earlier blocks, except for the rv's of the current block. When the constraints are represented as BDDs, approaches, such as the following, are known for generating solutions to them:

[1] J. Yuan, K. Shultz, C. Pixley, and H. Miller. "Modeling Design Constraints and Biasing in Simulation Using BDDs." In Proceedings of International Conference on Computer-Aided Design, pages 584-589, November 1999.

[2] J. Kukula and T. Shiple. "Building Circuits from Relations." In Proceedings of Computer Aided Verification, 12th International Conference, pages 113-123, July 2000.

The above references [1] and [2] are herein incorporated by reference.

The generate phase processes the solution generators in reverse order, from $G^p$ down to $G^0$. Each such processing of a solution generator determines a permissible value assignment, for each rv of a block, from $R^p$ down to $R^0$.

The first solution generator to be solved, $G^p$, has rv support only in $R^p$, expressed symbolically as: $S(G^p) \subseteq R^p$. Assuming application of the compile phase has reduced it to a sufficiently small size, existing constraint solving technology can be used to find a solution for $G^p$ for the rv's in $R^p$ given a particular state of sv's. For example, with $G^p$ represented as a BDD, a node cardinality of the BDD for $G^p$ that is solvable in a practical time period might be considered to be less than 100 million.

At each step "j" in the generate process, where a solution generator $G^j$ is to be solved, values for all rv's in all blocks $R^p$ down to $R^{j+1}$ have already been generated by earlier steps. Because of the procedure by which $G^j$ was produced in the compile phase, solution generator $G^j$ only has rv support for blocks $R^j$, $R^{j+1}$, ..., $R^p$ (put another way, for any block "i," where i<j, it is known that $S(G^j) \cap R^i = \{\ \}$). Thus, at each step "j" a component constraint solver can find a solution for $G^j$ simply by solving for the rv's in $R^j$, given that values have already been chosen, in the earlier stages of the generate process, for the rv's in $R^{j+1}$, $R^{j+2}$, ... $R^p$ (and values for the sv's are a given). In this way, step-by-step from "p" down to zero, values can be generated for all the rv's.

Figure 2A:
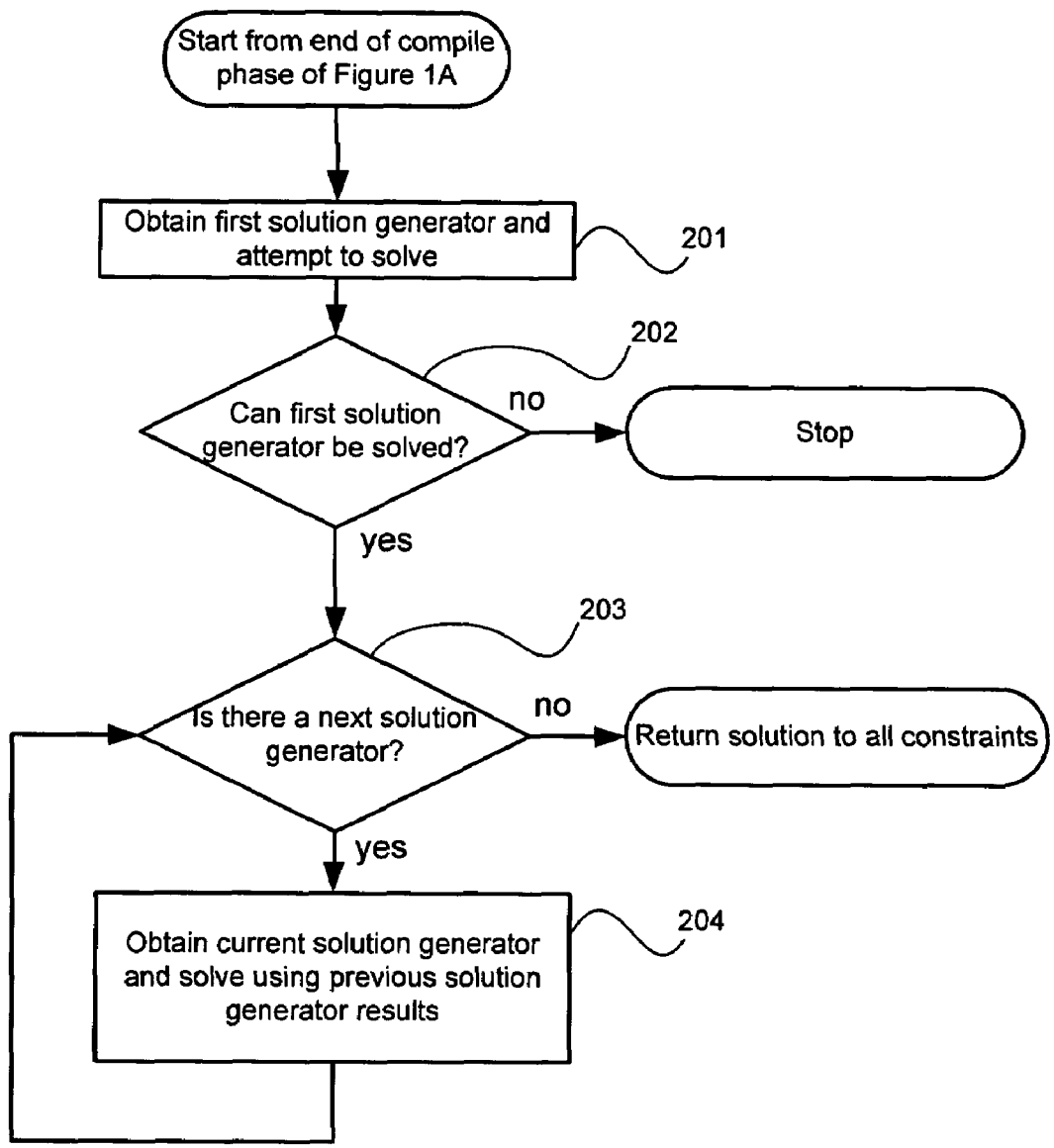
FIGS. 2A-2B graphically depict the generate phase process.
Figure 2B:
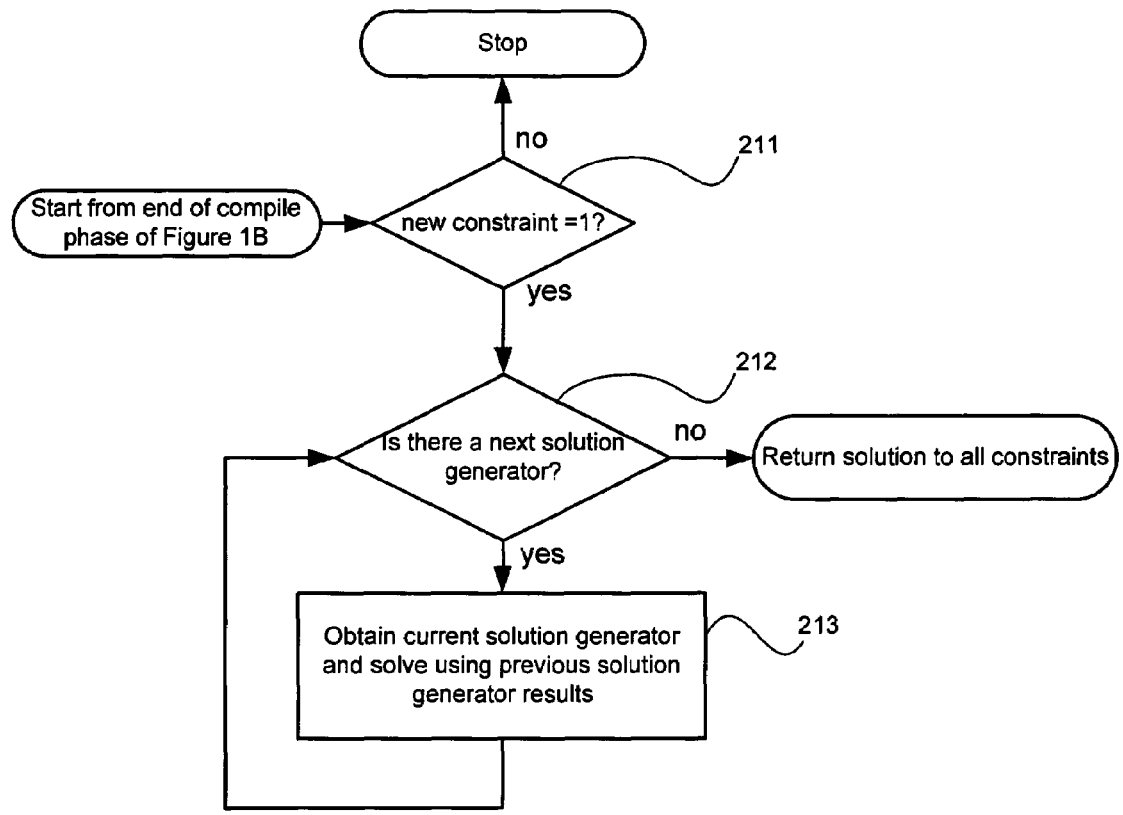
Figure 3:
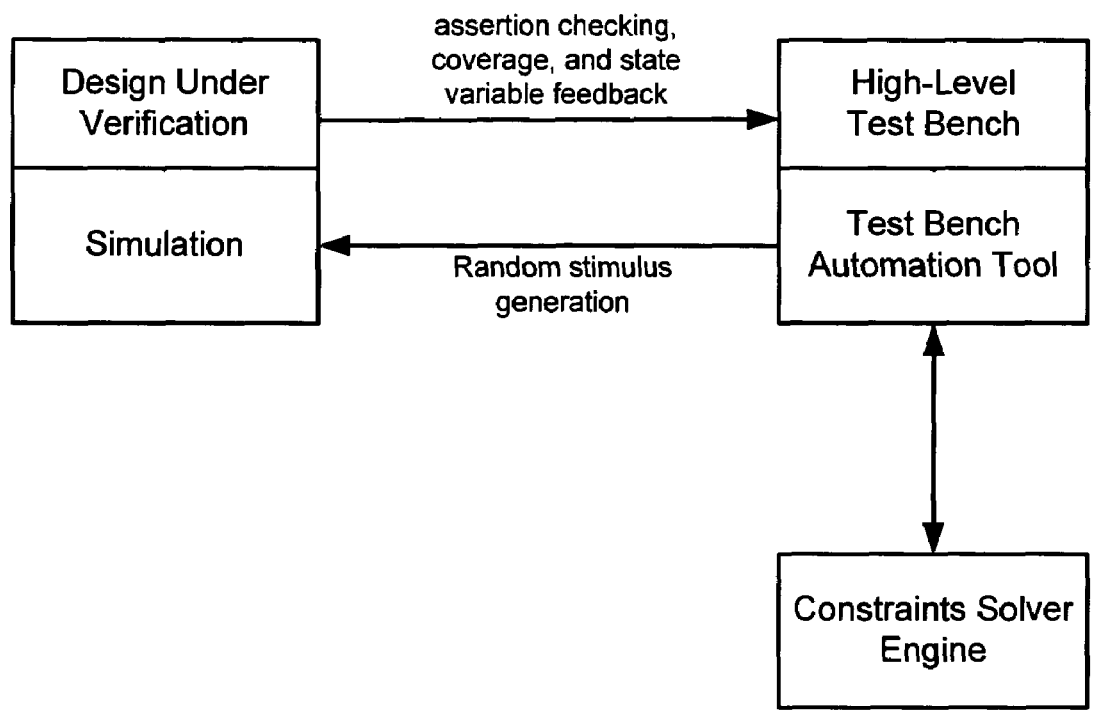
FIG. 3 depicts a high-level view of a commonly used functional verification methodology.

Assuming that a $\exists R^p(G^p)$ is determined in the compile phase (as determined in accordance with FIG. 1B), the procedure of FIG. 2B begins by testing (step 211) whether, for the given sv's, $\exists R^p(G^p)$ has a value of one. If $\exists R^p(G^p)$ is equal to one, then it is known that all the solution generators will be solvable in the generate phase. In this case, FIG. 2B iterates (using steps 212 and 213) over each solution generator, in reverse order, from $G^p$ down to $G^0$. However, if $\exists R^p(G^p)$ is zero, then the rest of the generate phase is avoided.

If $\exists R^p(G^p)$ is not produced (in accordance with FIG. 1A), the generate phase (as shown in FIG. 2A) will begin by attempting to solve (step 201) the solution generator $G^p$ that it obtains for the rv's of block $R^p$. If a solution to $G^p$ is found (the "yes" path of step 202), for the given sv's, then it is known that all the remaining solution generators will be solvable in the generate phase. In this case, the remainder of the procedure of FIG. 2A is performed (by steps 203 and 204, which operate like, respectively, steps 212 and 213 of FIG. 2B). If $G^p$ cannot be solved (the "no" path of step 202), for the given sv's, then the rest of the generate phase should be avoided.

With regard to the process of FIG. 2A, it should be noted that if the optimization for its compile phase of FIG. 1A, as described above, is implemented, and if the compile phase is terminated after having produced a $G^j$ for a block $R^j$, where j<p, then the generate phase of FIG. 2A begins by attempting to solve the solution generator $G^j$ for all blocks of rv's from $R^{j+1}$ to $R^p$. Other than this change in the first solution generator solved, from $G^p$ to $G^j$, the process of FIG. 2A operates the same as described above.

With respect to auxiliary variables, it can be possible for certain such variables to appear only once (referred to as "isolated" auxiliary variables). A pre-processing phase can be added to the generation phase to detect such isolated auxiliary variables and remove them from the constraint set to be solved by existential quantification.

2.4 Discussion of Example Executions

Section 3 lists an example execution of the procedure of the Sections 2.2 and 2.3 upon an example set of constraints. Section 3.1 depicts the compile phase of such example, while Section 3.2 depicts the generate phase.

Section 3.1, under "Start," lists the initial set $C^0$ of constraints to be processed and a partition in which each rv of $C^0$ appears in its own block. Because each constraint of $C^0$ shares an rv with another constraint, as each block is processed, from $R^0$ to $R^2$, an additional constraint of $C^0$ is added to the solution generator determined. Therefore, $G^0$ comprises one constraint, while $G^1$ is a conjunction of two constraints and $G^2$ is a conjunction of all three. However, as can be seen in the structure of $G^2$, the conjunctions, that can rapidly increase the size of the BDD representation, are interleaved with the removal of random variables by existential quantification that can decrease the size of the BDD representation.

Section 3.1, with respect to block $R^3$, depicts the difference between the FIGS. 1A and 1B approaches to compilation. While the approach of FIG. 1A ends compilation with determining $G^3$, the method of FIG. 1B continues to determine $\exists R^3(G^3)$, and then tests $\exists R^3(G^3)$ for whether it is equal to one.

Section 3.2 is divided into the FIGS. 2A and 2B approaches to generation of a solution of $C^0$. Under the FIG. 2A approach, it is not initially known whether $G^3$ can be solved. If it can be, then it is known that all the remaining solution generators, $G^2$–$G^0$, can be solved as well. Under the FIG. 2B approach, since it is already known from the compile phase that $G^3$ can be solved, all the solution generators are simply solved in reverse order, from $G^3$ down to $G^0$.

Section 4 depicts an example use of the present invention in conjunction with a decomposition procedure, such as that disclosed in the '0505 application. The example of Section 4 is also drawn from the '0505 application.

Since the procedure of the present invention seeks to conjoin constraints, it can be beneficial, in terms of minimizing the BDD size expansion resulting from such conjoining, to apply a decomposition procedure to such constraints. Such application of decomposition can be applied as a pre-processing procedure, and this is the approach of Section 4.

Section 4 addresses a constraint "F" that specifies that two 3-bit buses, "A" and "B," be kept equal. Such constraint "F" first has its rv's renamed, to x0 through x5, to be in conformance with the pseudo-code description of the '0505 application. Constraint "F" is then shown as set of three independent, two-variable, expressions as a result of applying the decomposition procedure of the '0505 application. As with the example of Section 3, a partition of the variables of "F" is chosen in which each is assigned to a separate block.

Section 4.1 depicts application of the procedure of the present invention to the non-decomposed form of "F." As can be seen, because "F" comprises just one constraint, the interleaving of conjunction and existential quantification sought by the present invention has no opportunity to be effective in decreasing the sizes of the BDD representations. $G^0$ is represented by a maximally sized BDD, that is a conjunction of all the expressions of "F" and has no variables removed by existential quantification. The size of the BDD for each subsequent solution generator, from $G^1$ to $G^5$, shrinks simply to the successive application of existential quantification to additional variables.

Section 4.2 depicts application of the procedure of the present invention to a decomposed form of "F." As can be seen, the maximum BDD size for a solution generator of Section 4.2 is certain to be considerably smaller than the maximum BDD size of Section 4.1. The largest BDD's for Section 4.2 will be for solution generators $G^0$, $G^2$ and $G^4$, which have the most number of variables, but each of these solution generators has only two variables, compared with six variables for the $G^0$ of Section 4.1.

2.5 Other Applications

The present invention has applications beyond that of constraint solving. For example, the present invention can be used in conjunction with known image computation approaches. Image computation has been applied to electronic design automation tools for integrated circuit design and, in particular, to formal circuit verification.

In order to perform image computation, the following representations (typically of type BDD), of a finite state machine (FSM) "M" to be processed, can be determined: an initial set of states of FSM "M" ($S_0$), the transition relation ($T_M$) of FSM "M" (in either partitioned or unpartitioned form), and a set of error states ($E_M$) which, if entered by the FSM, indicate erroneous operation. More generally, $E_M$ can be viewed as a set of goal states, for which it is desired to be determined whether "M" can reach any of them. For the below discussion, it is assumed that the image computation is being done with a purpose of verifying the operation of "M" by determining whether it can reach any of the error states. However, the technique is applicable to other applications of image computation as well.

While the constraints solving processes discussed above in Section 2 are described in terms of operating upon constraints, when used in the context of image computation, such referral to a "constraint" is understood to refer to an FSM-related representation that is being processed. Such FSM-related representations can include any of the following: a BDD representation of a sets of states (such as $S_0$), a BDD representation of a transition relation (such as $T_M$), a BDD representation resulting from application of a constraint solving process to FSM-related representations.

A transition relation $T_M$ can be comprised of four classes of variables: present state, primary input, auxiliary, and next state. Present state variables encode a present state of "M," while primary input variables permit "M" to respond to changing environmental conditions. Auxiliary variables are used for internal signaling within "M," often useful for expressing the transition relation in partitioned form. For use in partitioning, auxiliary variables can be expressed as a function of the present state and primary inputs. The next state variables encode the next state into which "M" should transition.

A typical use of image computation is as follows. With the set of all states "M" can be in at a time "t" represented as $S_t$, an objective of image computation is to determine the following sequence of sets: $S_0$, $S_1$, $S_2$, . . . Such determination of state sets can be continued until a fixed point is reached (i.e., until an $S_t$ is equal to an $S_{t+1}$). For each $S_t$ determined, if an intersection between an $S_t$ and $E_M$ is found, then it has been determined that "M" can enter a state considered to be erroneous within "t" transitions of "M" from its initial state. Alternatively, rather than determining a sequence of sets of states until a fixed point is reached, for each $S_t$ determined, the $S_t$ can be tested for intersection with $E_M$ and, if such intersection is found, the further determination of the sequence can be halted.

While such image computation has determined that there is at least one state reachable by "M," at a time "t," that is erroneous, a known limitation of such an image computation is that a particular transition path, from an initial state to an erroneous state, is not known.

Determining any set $S_{t+1}$ from a set $S_t$ is a similar process to the compile phase described above in Section 2.2. The role of the rv's in Section 2.2 is assumed by the following variables of $T_M$: present state, primary input, and auxiliary. Specifically, the present state, primary input, and auxiliary variables are divided into blocks in accordance with a partition. Then, on a blockwise basis, conjunction and existential quantification of $T_M \cap S_t$ is performed (where $T_M \cap S_t$ represents a set of separate BDDs with implicit conjunction between its members), in an interleaved fashion, to minimize the maximum-sized BDD needed. The resulting BDD ($S_{t+1}$) is a function only of the next state variables and represents the permissible states of "M" at time t+1.

The compile process of FIG. 1A is suitable for producing an $S_{t+1}$ BDD, provided that test 104 is moved after step 107 (i.e., step 103 proceeds directly to step 105; step 107 proceeds directly to test 104; "yes" path of test 104 proceeds directly to step 101). With this change, the last iteration of FIG. 1A produces a set of constraints $C^{p+1}$ (which may also be referred to as a set of FSM-related representations $C^{p+1}$), that is dependent upon no variables except for the next state variables, and it therefore represents the set $S_{t+1}$. Step 101 obtains a next block, selected according to a partition of the present state, primary input and auxiliary variables. The set of current-block-related constraints (which may also be referred to as the set of current-block-related FSM-related representations), selected from in step 102, begins initially as the following set of BDDs: a BDD representing a set of states $S_t$, and BDDs comprising the partitioned transition relation $T_M$.

In each application of the present invention to finding an $S_{t+1}$ from an $S_t$, the production of successive sets of constraints (i.e., the production of successive sets of FSM-related representations), from $C^0$ to $C^{p+1}$, corresponds generally to the known approaches of interleaving to perform image computation. However, the present invention goes beyond such known approaches by saving the solution generator terms $G^0$ to $G^p$.

Once a set of states at a time "t" is determined to intersect $E_M$, the saving of the generator terms permits a specific sequence of states, from an element of $E_M$ at time "t" back to an element of $S_0$ at time zero, to be determined.

The finding of such a specific sequence of states can begin by finding a specific element of $E_M$, referred to herein as $e_M$, that is also an element of $S_t$.

By a single application of the generate phase of Section 2.3, upon the set of solution generators $G^0$ to $G^p$, that resulted from the image computation compile of $S_t$ from $S_{t-1}$, a specific element $e_{t-1}$ of $S_{t-1}$, wherein $e_{t-1}$ is able to produce $e_M$, is determined. In this type of generate phase, the value of $e_M$ serves the function of the sv's since $e_M$ provides the given values, with the rv's to be solved for being the variables of type: present state, primary input and auxiliary. The value of $e_{t-1}$ found corresponds to the solution found for the present state variables. It should be noted that solutions for the primary input and auxiliary variables are also found. The finding of a solution to the primary input variables is particularly useful (in such applications as an integrated circuit design verification tool) since the proper input combination, to be applied at a time t−1, is also needed, in addition to having $e_{t-1}$, in order to cause "M" to transition from $e_{t-1}$ to $e_M$ (where $e_M$ can also be referred to as $e_t$). While a solution of the auxiliary variables is also found, this solution is generally not as important as those for the present state and primary inputs since the auxiliary variables are derived from the present state and primary input variables.

Once $e_{t-1}$ is known, by another single application of the generate phase of Section 2.3, upon the set of solution generators $G^0$ to $G^p$, that resulted from the image computation compile of $S_{t-1}$ from $S_{t-2}$, a specific element $e_{t-2}$ of $S_{t-2}$, wherein $e_{t-2}$ is able to produce $e_{t-1}$, is determined. Once again, $e_{t-1}$ serves the function of the sv's since $e_{t-1}$ provides the given values, with the rv's to be solved for being the variables of type: present state (providing $e_{t-2}$), primary input and auxiliary.

After "t" such single applications of the generate phase of Section 2.3, upon each of the "t" sets of solution generators, a specific path of states, back to an $e_0$ that is a member of $S_0$, is found. In addition to finding a specific path of states, a specific sequence of primary input combinations, to be applied with each of those states, can also determined.

Figure 4:
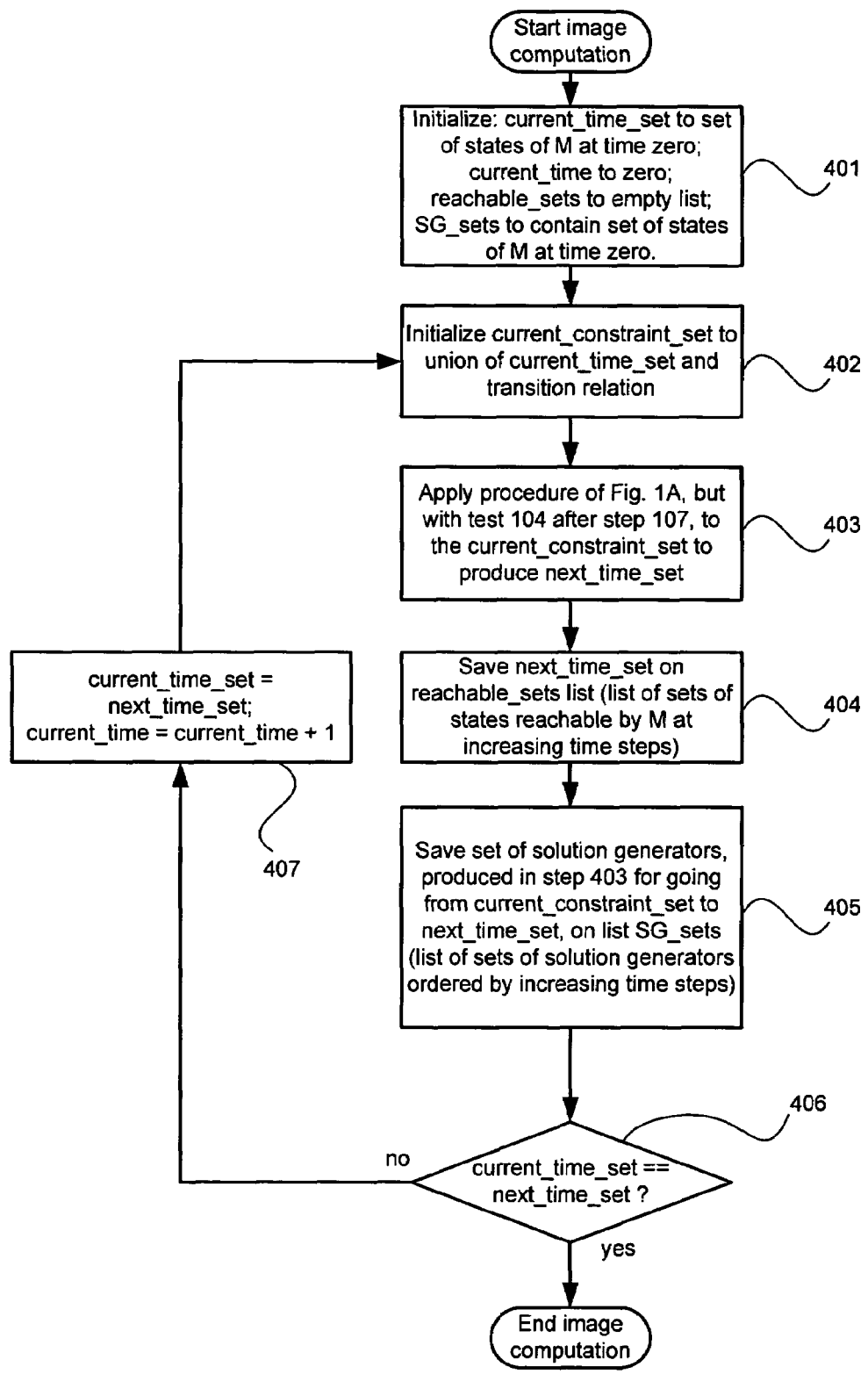
FIG. 4 depicts an example image computation process.
Figure 5:
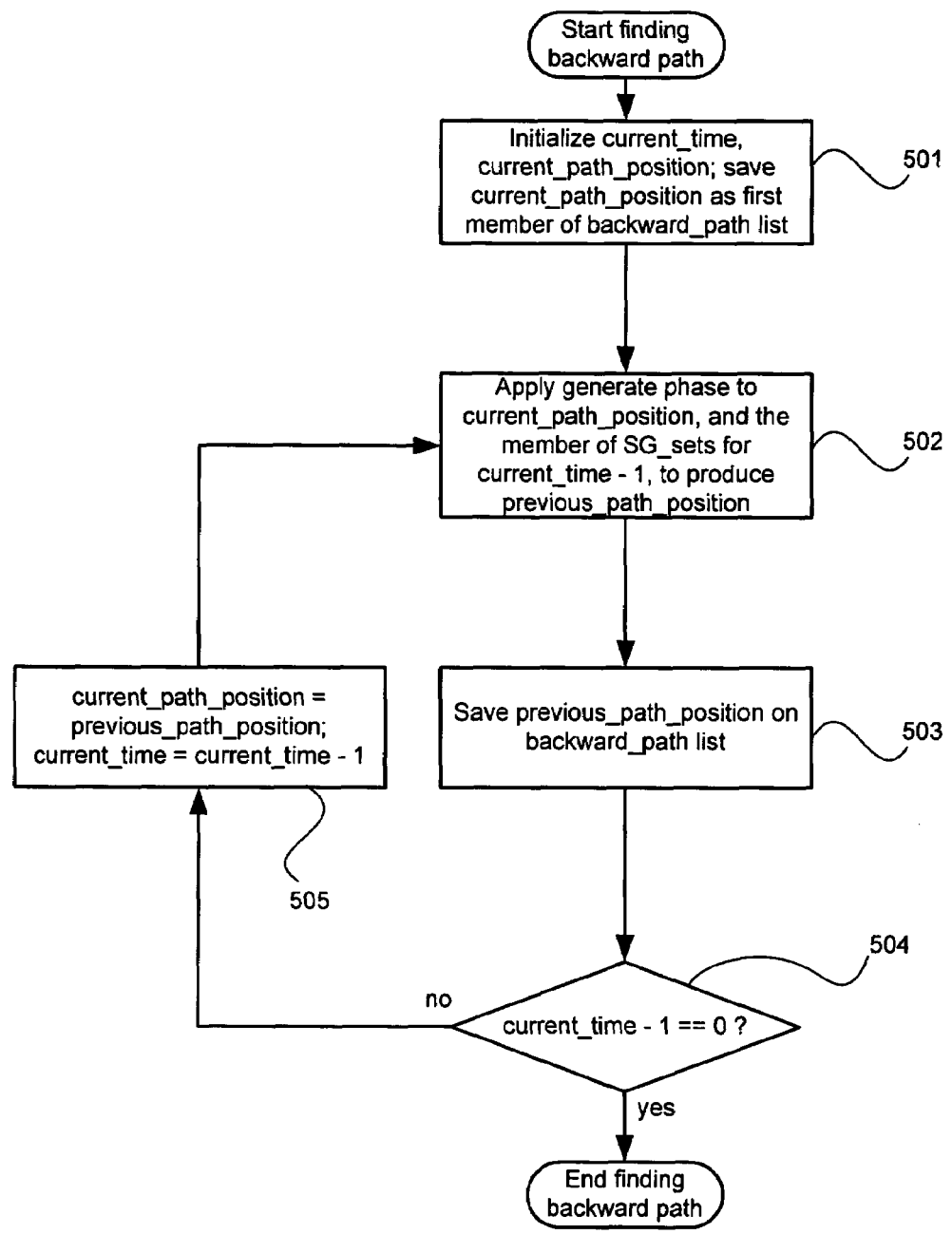
FIG. 5 depicts an example path determination process, based upon the results of an image computation process.

Example processes of image computation and backward path determination are depicted, respectively, in FIGS. 4 and 5.

More specifically, FIG. 4 depicts the production of two lists: reachable_sets and SG_sets. The process proceeds until a fixed point is reached. As discussed above, an alternative approach is to continue the process until either a fixed point is reached (with no intersection with an error state being found) or ending the process (of producing sets of reachable states at successive time steps) as soon as an intersection with an error state is found. Each member of the reachable_sets list is a BDD representing an $S_t$. The members of the list are ordered according to incrementally increasing time steps, from $S_0$ until the fixed point is reached. Each member of SG_sets is a set of the solution generators that was saved when compiling an $S_{t+1}$ from an $S_t$. As with reachable_sets, the SG_sets list is ordered according to incremental time steps, from time zero until the time when the fixed point is reached. The list reachable_sets corresponds to a type of known result of image computation, while the list SG_sets is a result, new to the present invention, that permits a backward path of states (from an error state to a state in $S_0$) to be found by constraint solving.

For FIG. 5, it is assumed that an $S_t$ that intersects with $E_M$ has already been found, and that a specific element $e_M$ of $E_M$ has already been found. The procedure of FIG. 5 applies the sets of solution generators of SG_sets, in reverse time order, to produce a list (backward_path) from $e_M$ back to $e_0$ (where $e_0 \in S_0$). Each application of the generate phase to a set of solution generators produces a solution to the present state (providing an $e_{t-1}$), primary input and auxiliary variables for the given values of the next state variables (as specified by an $e_t$).

The process of FIG. 4 begins (step 401) by performing the following initializations. The list SG_sets is initialized to empty. The list reachable_sets is initialized to $S_0$. The current_time_set is set to $S_0$, and current_time is set to zero.

Next (step 402), current_constraint_set (that contains FSM-related representations) is initialized to the union of the contents of current_time_set and the BDDs representing the transition relation $T_M$. Note that while a union operation is done to combine current_time_set and the BDDs of the transition relation, there is an implied AND among all the members of the set current_constraint_set.

The compile procedure of FIG. 1A, modified as described above, is applied (step 403) to current_constraint_set to produce next_time_set, where next_time_set is $S_{t+1}$ if current_time_set is $S_t$.

The set produced for next_time_set is added to the list reachable_sets (step 404).

The set of solution generators, produced in step 403 when compiling next_time_set from current_constraint_set, is saved as an element of the list SG_sets. Step 405.

If the current_time_set is equal to the next_time_set (test 406), then a fixed point has been reached and the image computation is stopped ("yes" path of 406 is taken).

Alternatively, if a fixed point has not been reached ("no" path of 406 is taken), current_time_set and current_time are advanced to the next time step (step 407). The process then iterates (beginning by a return to step 402).

The process of FIG. 5 begins (step 501) by performing the following initializations. The variable current_time is set to the time step of $e_M$ (which, for explanation of FIG. 5, we shall refer to as "t"), with current_path_position set to $e_M$. Also, $e_M$ is added as the first member of the backward_path list.

Next (step 502), the generate phase is applied to the current_path_position, and the member of the SG_sets list for the time step current_time minus one, to produce previous_path_position. If current_path_position is $e_M$, then the set of solution generators of time step t−1 are used in combination with $e_M$ to find an $e_{t-1}$. Note that the primary inputs, to be applied to "M" when in state $e_{t-1}$ to go to state $e_M$, are also found.

The state of the previous time step that has been found, referred to by previous_path_position, is added to the backward_path list. Step 503. Note that at this point in the process, the corresponding primary inputs (to be applied when "M" is in state $e_{t-1}$ in order to cause it to transition to $e_M$) can also be added to a backward list of primary inputs combinations that corresponds to the backward_path list.

If the iterative process of constructing a backwards path from $e_M$ to $e_0$ has not yet reached time zero (the "no" path of test 504 is taken), then initializations are performed (step 505) for another iteration of the process. Specifically, the current_path_position is moved one time-step backwards to the value of previous_path_position and current_time is decremented by one. The process then continues (step 502) with another application of the generate phase.

3. Listing of Example Execution 3.1 Compile Phase

Start:
  $C^0=\{b+a==6; b+c<5; c+d+e==10\}$
  $R^0=\{a\}$
  $R^1=\{b\}$
  $R^2=\{c\}$
  $R^3=\{d\}$
  Where "e" is an sv Block $R^0$:
  $G^0=\{b+a==6\}$
  $\exists R^0(G^0)=\exists R^0(b+a==6)$
  $C^1=\{\exists R^0(b+a==6); b+c<5; c+d+e==10\}$ Block $R^1$:
  $G^1=\{\exists R^0(b+a==6)\cdot b+c<5\}$
  $\exists R^1(G^1)=\exists R^1(\exists R^0(b+a==6)\cdot b+c<5)$
  $C^2=\{\exists R^1(\exists R^0(b+a==6)\cdot b+c<5); c+d+e==10\}$ Block $R^2$:
  $G^2=\{\exists R^1(\exists R^0(b+a==6)\cdot(b+c<5)\cdot c+d+e==10\}$
  $\exists R^2(G^2)=\exists R^2(\exists R^1(\exists R^0(b+a==6)\cdot b+c<5)\cdot c+d+e==10)$
  $C^3=\{\exists R^2(\exists R^1(\exists R^0(b+a==6)\cdot b+c<5)\cdot c+d+e==10)\}$ Block $R^3$:
  $G^3=\{\exists R^2(\exists R^1(\exists R^0(b+a==6)\cdot b+c<5)\cdot c+d+e==10)\}$
  For FIG. 1B approach:
  $\exists R^3(G^3)=\exists R^3(\exists R^2(\exists R^1(\exists R^0(b+a==6)\cdot b+c<5)\cdot c+d+e==10))$ 3.2 Generate Phase FIG. 2A approach:
  For the given value of sv "e," solve $G^3$ for $R^3$. If $G^3$ can be solved, value for "d" has been found, otherwise no solution for $C^0$ exists.
  For the given value of sv "e," solve $G^2$ for $R^2$ (assuming $G^3$ can be solved), using value found for "d."
  For the given value of sv "e," solve $G^1$ for $R^1$ (assuming $G^3$ can be solved), using values found for "c" and "d."
  For the given value of sv "e," solve $G^0$ for $R^0$ (assuming $G^3$ can be solved), using values found for "b," "c" and "d."

FIG. 2B approach:
  If $\exists R^3(G^3)=1$, for the given value of sv "e," continue with generate phase, otherwise no solution for $C^0$ exists.
  For the given value of sv "e," solve $G^3$ for $R^3$ (assuming $\exists R^3(G^3)=1$).
  For the given value of sv "e," solve $G^2$ for $R^2$, (assuming $\exists R^3(G^3)=1$) using value found for "d."
  For the given value of sv "e," solve $G^1$ for $R^1$, (assuming $\exists R^3(G^3)=1$) using values found for "c" and "d."
  For the given value of sv "e," solve $G^0$ for $R^0$ (assuming $\exists R^3(G^3)=1$) using values found for "b," "c" and "d."

4. Listing of Example Execution, with and without Decomposition

Notation used for this example: a minus sign, preceeding a variable name, represents a NOT sign (e.g., -x0 is the NOT of x0); two variables in immediate succession are conjoined (e.g., -x0-x1 is the AND of -x0 and -x1).

Start with a constraint that two 3-bit buses, called A and B, must be equal.

Figure 6:
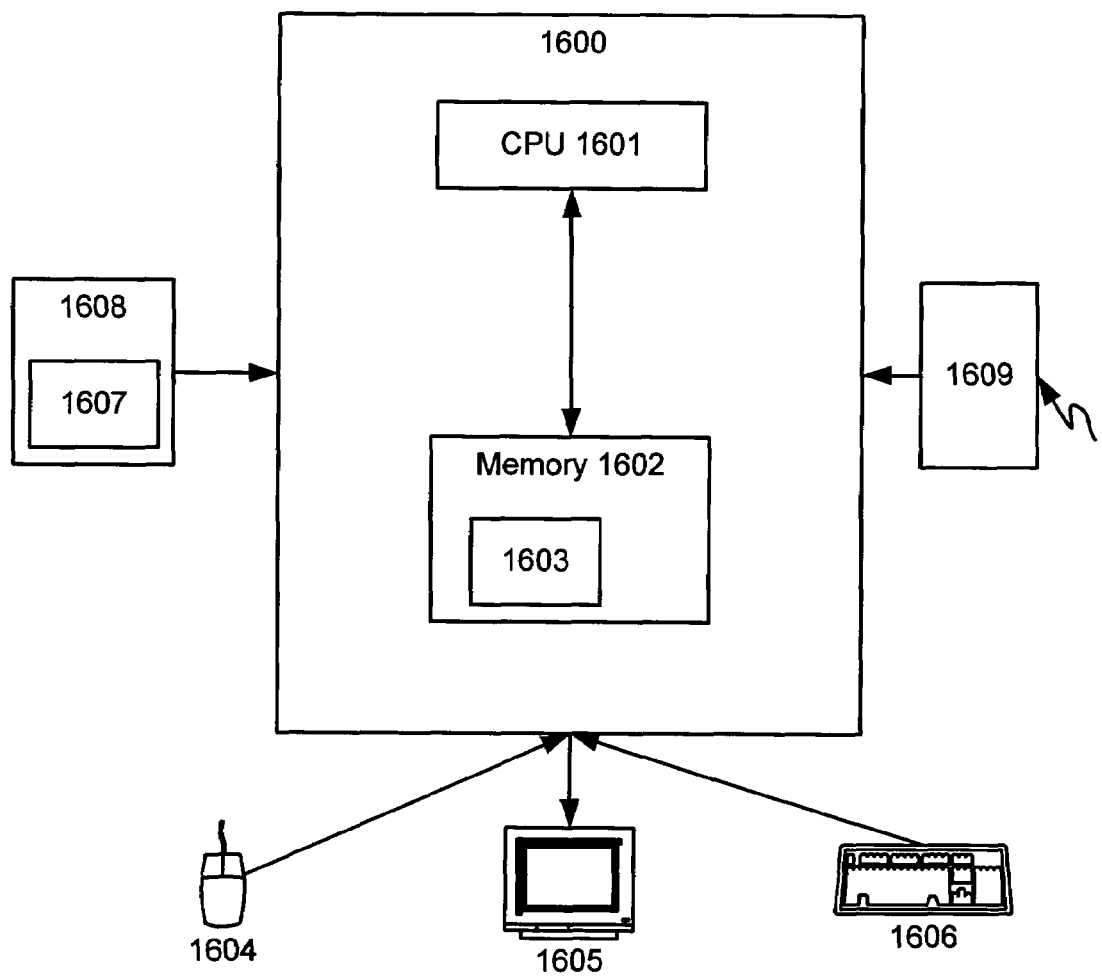
FIG. 6 shows a computing hardware environment within which to operate the present invention.

This can be represented by the following function:
  $F\ (a0,b0,a1,b1,a2,b2)=(a0b0+-a0-b0)\cdot(a1b1+-a1-b1)\cdot(a2b2+-a2-b2)$ To follow variable notation of pseudo-code, map the variables of F as follows:
  $F(a0,b0,a1,b1,a2,b2)=F(x0,x1,x2,x3,x4,x5)=(x0x1+-x0-x1)\cdot(x2x3+-x2-x3)\cdot(x4x5+-x4-x5)$ Decomposed F:
  Result=$\{(x0x1+-x0-x1),\ (x2x3+-x2-x3),\ (x4x5+-x4-x5)\}$ Blocks:
  $R^0=\{x0\}$
  $R^1=\{x1\}$
  $R^2=\{x2\}$
  $R^3=\{x3\}$
  $R^4=\{x4\}$
  $R^5=\{x5\}$ 4.1 Result of Compile Phase Upon Non-Decomposed F
  $G^0=\{$
  $(x0x1+-x0-x1)\cdot(x2x3+-x2-x3)\cdot(x4x5+-x4-x5)$
  $\}$
  $G^1=\{\exists R^0($
  $(x0x1+-x0-x1)\cdot(x2x3+-x2-x3)\cdot(x4x5+-x4-x5)$
  $)\}$
  $G^2=\{\exists R^1(\exists R^0($
  $(x0x1+-x0-x1)\cdot(x2x3+-x2-x3)\cdot(x4x5+-x4-x5)$
  $))\}$
  $G^3=\{\exists R^2(\exists R^1(\exists R^0($
  $(x0x1+-x0-x1)\cdot(x2x3+-x2-x3)\cdot(x4x5+-x4-x5)$
  $)))\}$
  $G^4=\{\exists R^3(\exists R^2(\exists R^1(\exists R^0($
  $(x0x1+-x0-x1)\cdot(x2x3+-x2-x3)\cdot(x4x5+-x4-x5)$
  $))))\}$
  $G^5=\{\exists R^4(\exists R^3(\exists R^2(\exists R^1(\exists R^0($
  $(x0x1+-x0-x1)\cdot(x2x3+-x2-x3)\cdot(x4x5+-x4-x5)$
  $)))))\}$ 4.2 Result of Compile Phase Upon Decomposed F
  $G^0=\{(x0x1+-x0-x1)\}$
  $G^1=\{\exists R^0(x0x1+-x0-x1)\}$
  $G^2=\{(x2x3+-x2-x3)\}$
  $G^3=\{\exists R^2(x2x3+-x2-x3)\}$
  $G^4=\{(x4x5+-x4-x5)\}$
  $G^5=\{\exists R^4(x4x5+-x4-x5)\}$ 5. Hardware Environment The constraint set solving architecture of the present invention can be executed within a computing environment (or data processing system) such as that of FIG. 6. FIG. 6 depicts a workstation computer 1600 comprising a Central Processing Unit (CPU) 1601 (or other appropriate processor or processors) and a memory 1602. Memory 1602 has a portion of its memory in which is stored the software tools (or computer programs) and data of the present invention. While memory 1603 is depicted as a single region, those of ordinary skill in the art will appreciate that, in fact, such software may be distributed over several memory regions or several computers. Furthermore, depending upon the computer's memory organization (such as virtual memory), memory 1602 may comprise several types of memory (including cache, random access memory, hard disk and networked file server). Computer 1600 can be equipped with a display monitor 1605, a mouse pointing device 1604 and a keyboard 1606 to provide interactivity between the software of the present invention and the chip designer. Computer 1600 also includes a way of reading computer readable instructions from a computer readable medium 1607, via a medium reader 1608, into the memory 1602. Computer 1600 also includes a way of reading computer readable instructions via the Internet (or other network) through network interface 1609.

In one embodiment, the processes for solving constraints can be implemented using software produced by Synopsys, Inc., of Mountain View, Calif., USA. Examples of such Synopsys software are: OpenVera High Level Verification Language (including its associated electronic design automation software) and Magellan RTL Formal Verification. In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A computing environment comprising a computer program, the computer program for solving constraints during functional verification of a representation of an electronic design of an integrated circuit (IC), the computer program comprising the following steps when executed by a data processing system:
    selecting a first set of block-related constraints, from a first set of constraints, according to a first block;
    identifying a first set of non-block-related constraints, from the first set of constraints, not selected for the first set of block-related constraints;
    conjoining the first set of block-related constraints to produce a first solution generator;
    existentially quantifying the first block from the first solution generator to produce a first new constraint;
    computing a union of the first new constraint and the first set of non-block-related constraints to produce a second set of constraints;
    selecting a second set of block-related constraints, from the second set of constraints, according to a second block;
    conjoining the second set of block-related constraints to produce a second solution generator;
    solving the second solution generator; and
    solving the first solution generator using a second result of solving the second solution generator.

2. A method for solving constraints during functional verification of a representation of an electronic design of an integrated circuit (IC), comprising:
    selecting a first set of block-related constraints, from a first set of constraints, according to a first block;
    conjoining the first set of block-related constraints to produce a first solution generator;
    existentially quantifying the first block from the first solution generator to produce a first new constraint;
    identifying a first set of non-block-related constraints, from the first set of constraints, not selected for the first set of block-related constraints;
    computing a union of the first new constraint and the first set of non-block-related constraints to produce a second set of constraints;
    selecting a second set of block-related constraints, from the second set of constraints, according to a second block;
    conjoining the second set of block-related constraints to produce a second solution generator;
    solving the second solution generator; and
    solving the first solution generator using a second result of solving the second solution generator.

3. The method of claim 2, further comprising:
    defining a partition, including the first block, prior to selecting a first set of block-related constraints.

4. The method of claim 2, further comprising:
    defining a partition, including the second block, dynamically by applying a metric to the second set of constraints.

5. The method of claim 2, further comprising:
    introducing at least one auxiliary variable, prior to the step of selecting a first set of block-related constraints, in order to reduce a complexity of at least one constraint contained in the first set of constraints.

6. The method of claim 2, wherein the first block does not contain state variables.

7. The method of claim 2, further comprising:
    successively repeating the steps of existentially quantifying, identifying and computing a union on a current set of constraints to produce a next set of constraints, and selecting and conjoining on the next set of constraints according to a next block, until there is no next block.

8. The method of claim 2, further comprising:
    existentially quantifying the second block from the second solution generator to produce a second new constraint; and
    successively repeating the steps of identifying and unioning on a current set of constraints to produce a next set of constraints, and selecting, conjoining and existentially quantifying on the next set of constraints according to a next block, until there is no next block.

9. A computer program product for solving during functional verification of a representation of an electronic design of an integrated circuit (IC) comprising:
    a computer usable medium having computer readable code embodied therein for determining a solution to a set of constraints, the computer program product including:
    computer readable program code devices configured to cause a computer to effect selecting a first set of block-related constraints, from a first set of constraints, according to a first block;
    computer readable program code devices configured to cause a computer to effect conjoining the first set of block-related constraints to produce a first solution generator;
    computer readable program code devices configured to cause a computer to effect existentially quantifying the first block from the first solution generator to produce a first new constraint;
    computer readable program code devices configured to cause a computer to effect identifying a first set of non-block-related constraints, from the first set of constraints, not selected for the first set of block-related constraints;

computer readable program code devices configured to cause a computer to effect computing a union of the first new constraint and the first set of non-block-related constraints to produce a second set of constraints;

computer readable program code devices configured to cause a computer to effect selecting a second set of block-related constraints, from the second set of constraints, according to a second block;

computer readable program code devices configured to cause a computer to effect conjoining the second set of block-related constraints to produce a second solution generator;

computer readable program code devices configured to cause a computer to effect solving the second solution generator; and computer readable program code devices configured to cause a computer to effect solving the first solution generator using a second result of solving the second solution generator.

10. A computing environment comprising a computer program, the computer program for determining a solution to a set of constraints during functional verification of a representation of an electronic design of an integrated circuit (IC), the computer program comprising the following steps when executed by a data processing system:

selecting a first set of block-related constraints, from a first set of constraints, according to a first block;

conjoining the first set of block-related constraints to produce a first solution generator;

existentially quantifying the first block from the first solution generator to produce a first new constraint;

identifying a first set of non-block-related constraints, from the first set of constraints, not selected for the first set of block-related constraints;

computing a union of the first new constraint and the first set of non-block-related constraints to produce a second set of constraints;

selecting a second set of block-related constraints, from the second set of constraints, according to a second block;

conjoining the second set of block-related constraints to produce a second solution generator;

solving the second solution generator; and solving the first solution generator using a second result of solving the second solution generator.

* * * * *